United States Patent [19]

Endrédi et al.

[11] Patent Number: 5,237,266
[45] Date of Patent: Aug. 17, 1993

[54] PROCESS AND APPARATUS FOR DETERMINING THE CARRIER CONCENTRATION IN SEMICONDUCTORS

[75] Inventors: Gábor Endrédi; Péter Tüttö, both of Budapest, Hungary

[73] Assignee: Semiconductor Felvezeto Fizikai Labs. Rt, Budapest, Hungary

[21] Appl. No.: 728,608

[22] Filed: Jul. 11, 1991

[30] Foreign Application Priority Data

Jul. 12, 1990 [HU] Hungary .............................. 4177/90

[51] Int. Cl.$^5$ .............................................. G01R 31/26
[52] U.S. Cl. .................................. 324/158 D; 324/719
[58] Field of Search ................ 324/158 R, 79 R, 719; 224/158 D, 99 D

[56] References Cited

U.S. PATENT DOCUMENTS

| | | | |
|---|---|---|---|
| 3,605,015 | 9/1971 | Copeland, III ................. | 324/158 D |
| 3,886,370 | 5/1975 | Schubert et al. ............... | 324/158 D |
| 4,028,207 | 6/1977 | Faktor et al. .................... | 204/129.3 |
| 4,168,212 | 9/1979 | Faktor et al. .................... | 204/129.3 |
| 4,313,212 | 1/1982 | Whitlock .......................... | 324/79 R |
| 4,325,025 | 4/1982 | Corcoran et al. ................ | 324/158 R |
| 4,621,233 | 11/1986 | Davari et al. .................... | 324/158 R |
| 4,661,770 | 4/1987 | von Roos .......................... | 324/158 R |
| 4,839,588 | 6/1989 | Jantsch et al. ................... | 324/158 R |

FOREIGN PATENT DOCUMENTS 970428 7/1975 Canada .
765262 9/1980 U.S.S.R. .

OTHER PUBLICATIONS

PCT Search Report PCT/HU/91/00035, filed Jul. 12, 1990.

Primary Examiner—Ernest F. Karlsen
Attorney, Agent, or Firm—Flehr, Hohbach, Test, Albritton & Herbert

[57] ABSTRACT

The invention relates to apparatus and method for determining the carrier concentration profile of the carrier concentration in semiconductor materials, multi-layer semiconductor structures and semiconductor devices. According to the invention, applied between an ohmic contact and a rectifying contact formed on the semiconductor are a d.c. voltage resulting in a reverse bias, and two periodic excitation signals having frequencies $\Omega_1$ and $\Omega_2$. Frequency $\Omega_1$ is greater than $\Omega_2$ such that $\Omega_1$, $\Omega_2$, their difference $(\Omega_2-\Omega_2)$ and their sum $(\Omega_1+\Omega_2)$ are in the same order of magnitude. Two components from the semiconductor's electronic response to the excitation are selected for analysis. The first component is the response to the frequency $\Omega_1$ or $\Omega_2$, and the second component is a first order intermodulation product of one of $\Omega_1$ and $\Omega_2$. Carrier concentration is determined by simultaneous parallel analysis of these first and second components.

21 Claims, 2 Drawing Sheets

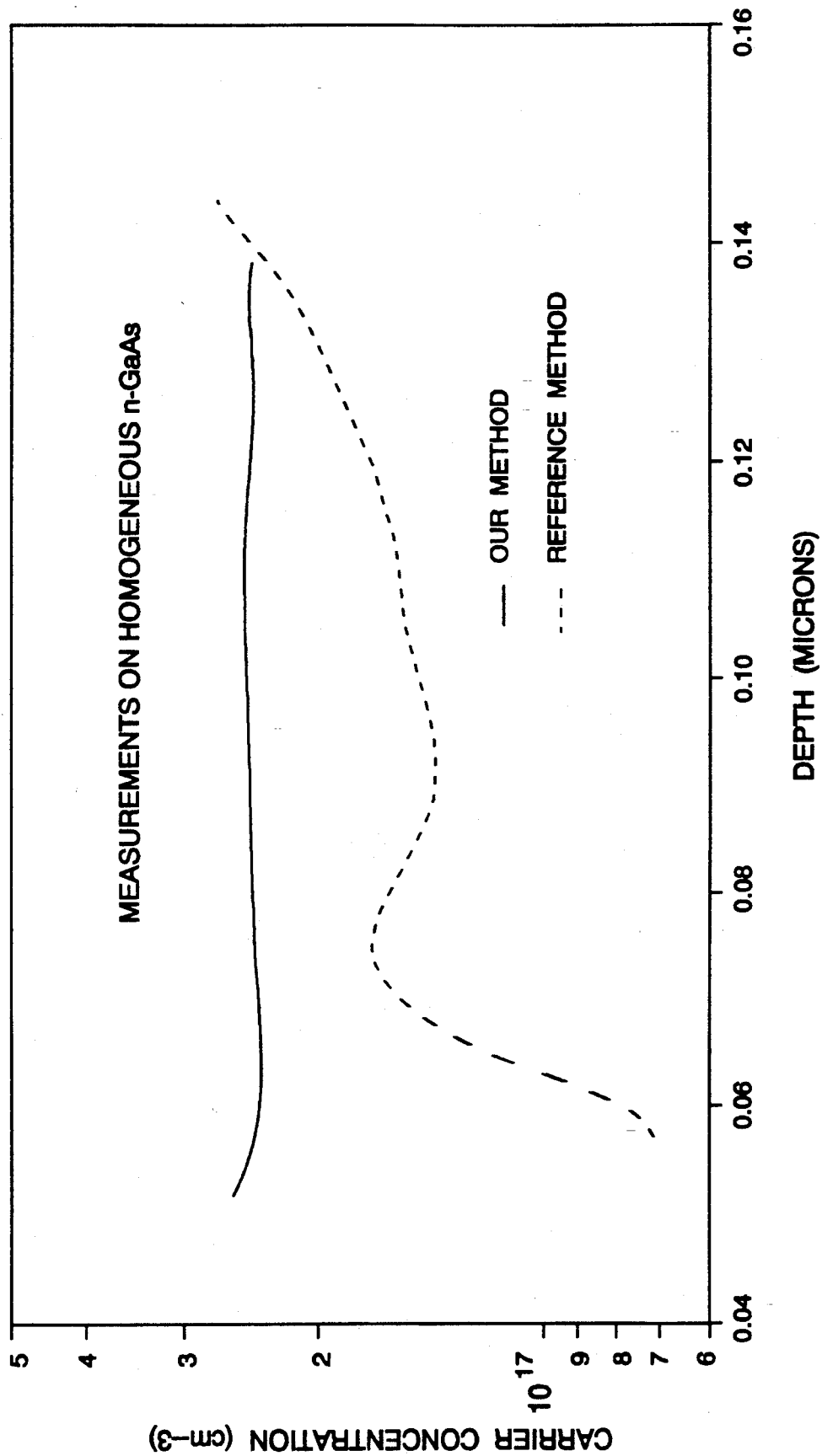

PROCESS AND APPARATUS FOR DETERMINING THE CARRIER CONCENTRATION IN SEMICONDUCTORS

FIELD OF THE INVENTION

The invention relates to a new method for determining the carrier concentration in semiconductors. The invention is also suitable for determining the depth profile of the carrier concentration in semiconductor materials, multi-layer semiconductor structures and semiconductor devices. In another aspect, the invention relates to an apparatus for determining the carrier concentration.

BACKGROUND ART

In semiconductors at usual temperatures, the concentration of carriers (electrons or holes) is essentially determined by the concentration and distribution of the dopants present in the semiconductor. Other impurities, depending on their density relative to the dopant concentration, may have a secondary effect on the carrier concentration. For each case, the distribution of carrier concentration is determined by the actual boundary conditions, such as the bias on the semiconductor sample, and the actual charge density values in the states of the external and internal interfaces.

Current technologies usually provide semiconductor materials and structures in which the impurity levels are considerably below the dopant concentrations, and the interface state densities are negligible. Therefore, the dielectrical properties of common semiconductor materials, e.g. silicon, gallium arsenide, are in good agreement with the properties of an "ideal" material in which the conductivity and carrier density vary with the location, whereas the dielectrical constant is not frequency dependent.

The basic methods used for testing semiconductor structures containing one space charge layer, manufactured from such semiconductors materials, are directly or indirectly based on the measurement of capacitance as a function of voltage, and are usually performed in the 1 Hz to 1 MHz frequency range. The upper limit of the frequency is determined by the values of the resistances connected in series with the capacitance of the interface or pn junction to be measured (including those of the sample and the contact), the effect of the radiation increasing parallel with the frequency increase, and the technical difficulties usually associated with high-frequency measurements. The lower measuring frequency is limited by an unavoidable increase in the measuring time, the insulation resistances which become more critical at lower frequencies, and the effect of the deep level impurities present in the sample, which are only capable of a slow response and are, therefore, measured only below a certain lower frequency limit.

There are a number of methods known in the art for determining the carrier concentration and its distribution as a function of depth in semiconductors. However, those with practical applicability are usually based on capacitance measurement.

These measurements require two electrical contacts: a so called ohmic contact the impedance of which is negligible relative to the impedance of the capacitance of the sample measured at the applied frequency or frequencies, and a so called rectifying (barrier) contact, having the current-voltage characteristics of a diode and resulting in a substantially higher transition resistance than the impedance of the sample to be measured at the test frequency (frequencies). These contacts may also be formed in nondestructive ways, such as by using a mercury electrode or forming an electrode by contacting an electrolyte with the semiconductor sample.

According to the simplest approach, the capacitance-voltage characteristics of the sample are recorded, and the results are numerically evaluated by a computer [see, e.g. Thomas, C.O. et al., *J. Electrochem. Soc.* 109, 1055–1061 (1962)].

This method is very inaccurate and is entirely unsuitable for testing structures having unstable electrical parameters or characteristics, or manufactured from materials containing large amounts of impurities and/or internal interfaces which can not follow the measuring frequency but follow the change in the bias when recording the capacitance-voltage characteristics.

To avoid these problems, and to produce a voltage signal directly proportional with the carrier concentration (sometimes on a logarithmic scale) so called modulation-type measuring techniques have been developed. In this case, in addition to the bias, a high-frequency measuring signal and a so called modulation signal are applied to the sample, the latter having orders of magnitude lower frequency than the measuring signal. An essential feature of this approach is that first the measuring signal and the most important modulation products produced by the nonlinearity of the sample, i.e. the products the frequencies of which equal to the sum and to the difference of the two frequencies (measuring signal and modulation frequencies) are amplified and rectified, followed by further amplification and rectification of the low frequency components of the rectified signal, the frequency of which is the same as the frequency of the modulation signal. The method to develop the modulation signal by repeated amplification and rectification explains the big difference between the measuring signal and modulation signal frequencies.

In both rectification steps usually phase-sensitive rectifiers are employed. The final signal is proportionate with the derivative of the capacitance-characteristic as a function of voltage (gradient), from which (knowing the capacitance, the surface of the sample, and the dielectrical constant of the sample material) the local value of the carrier concentration can be determined. If the measurement is performed by changing the bias, it is possible to determine the carrier concentration profile in a range with margins determined by the sample parameters. (The maximum depth is usually limited by the breakdown voltage of the rectifying contact, which can be exceeded only by destructive techniques, removing part of the sample material.) The carrier concentration is provided by analog or digital circuits and techniques.

These methods exist in numerous variations, differing in various technical details, including the manner of applying the bias and the measuring and modulating signals to the sample (voltage or current generator mode), and the actual techniques used for control of the amplitude of the a.c. signals according to the actual signal measured, etc. The main purpose of these variations is to provide the required information in a form convenient for the user, and in a form that is easy to record on an x-y recorder.

Such measuring techniques are for example, disclosed by Califano, F.P. and Luciano, A., *The Rev. of Sci. Instr.* 41, 865–869 (1970); Gordon, B.J. et al.: A new impurity profile plotter for epitaxy and device. Silicon Device Conf. Gaithersburg, Md., 1970; Baxandall, P.J. et al., *J. of Physics E.* 4, 213-221 (1971). In a typical embodiment, Faktor, M.M. et al. (U. K. Patent No. 1,482,929 and its U.S. equivalents Nos. 4,168,212 and 4,028,207), formed the rectifying contact by contacting a semiconductor with an electrolyte, and performed the measurement by using a 3 kHz measuring signal and a 30 Hz modulation signal.

The technique described by Copeland, J. A., *IEEE Trans. on El. Dev.* ED-16, 445-449 (1969) is based on a different principle. Only one measuring voltage is applied to the sample, and, as a result of the sample non-linearity, the current transported through the sample includes the harmonics of the measuring signal. The amplitude of the second harmonic can be considered as a derivative of the capacitance-voltage characteristic as a function of the high frequency voltage of the sample, from which the carrier concentration can be calculated. A necessary condition for the successful application of this technique is the use of a measuring signal free of the second harmonic.

The practical applicability of these techniques is limited. The problem usually is that when the semiconductor materials and structures are heavily contaminated or when instable (often unreproducible) contacts are employed (such are the electrolytesemi-conductor contacts), the capacitance-voltage characteristic and the carrier concentration distribution are not reproducible, therefore, the reliability of these techniques is not satisfactory. Apart from the exceptionally good-quality semiconductor materials, the above-mentioned disturbing effects are negligible only within a relatively narrow frequency range. The actual limits of this frequency range vary for different semiconductor materials. (The samples for which such a range can not be found, are considered unsuitable for characterization.)

SUMMARY OF THE INVENTION

The present invention relates to a measuring technique and arrangement which enables the characterization of semiconductor samples which can not be reliably characterized by the methods conventionally used for determining semiconductor characteristics. By using the method and measuring arrangement according to the present invention, semiconductor characteristics can be determined with a much higher accuracy than with the methods known in the art, and the parameters of the measurements can be very easily adapted to the quality of the actual sample to be characterized.

In one aspect, the present invention relates to a process for determining the carrier concentration in a semiconductor by applying between an ohmic contact and a rectifying contact formed on said semiconductor, a d.c. voltage resulting in a reverse bias $U_{dc}$, and two periodic excitation signals having the frequencies $\Omega_1$ and $\Omega_2$, respectively, wherein $\Omega_1$ is bigger than $\Omega_2$, such that $\Omega_1$, $\Omega_2$, their difference $(\Omega_- = \Omega_1 - \Omega_2)$ and their sum $(\Omega_+ = \Omega_1 + \Omega_2)$ are in the same order of magnitude, selecting two components from the electronic response of the semiconductor to the excitation, the first component being the electrical response to frequency $\Omega_1$ or $\Omega_2$, and the second component being a first order intermodulation product of one of $\Omega_1$ and $\Omega_2$, and determining the carrier concentration by simultaneous, parallel analysis of the first and second components.

In another aspect, the present invention relates to an apparatus for determining the carrier concentration in a semiconductor by the above-described method, comprising a semiconductor sample having an ohmic contact and a rectifying contact; means for applying a d.c. voltage between the two contacts, resulting in a reverse bias $U_{dc}$, and two periodic excitation signals having the frequencies $\Omega_1$ and $\Omega_2$, respectively; oscillators to generate the periodic excitation signals; means for generating reference signals; means for amplifying two components selected from the electronic response of the semiconductor to the excitation, the first component being the electrical response to the frequency $\Omega_1$ or $\Omega_2$, and the second component being a chosen first order intermodulation product of $\Omega_1$ and $\Omega_2$; and two phase-sensitive rectifiers for rectifying the selected two a.c. components.

BRIEF DESCRIPTION OF THE DRAWINGS

FIG. 2 the carrier concentration as a function of depth in a homogeneous n-type GaAs semiconductor material determined by two methods, i.e. by a method according to the invention (solid line) and by a reference method (dashed line).

DETAILED DESCRIPTION OF THE INVENTION

Figure 1:
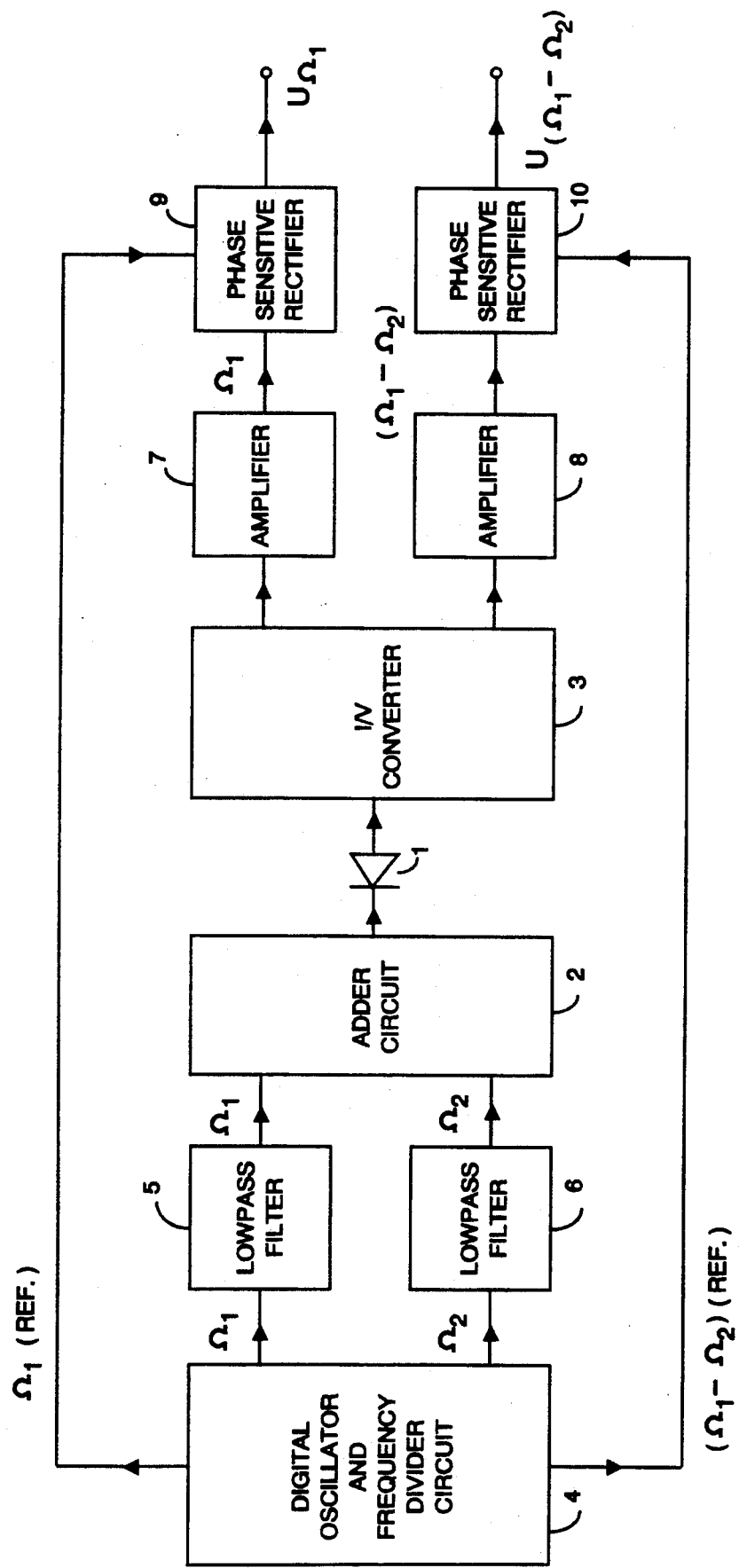
FIG. 1 a measuring arrangement suitable for realizing the process according to the invention.

We have examined the physical processes associated with the electrical response of semiconductor structures to periodic excitation. An a priori property of the space charge layer formed at semiconductor interfaces is that the change of this layer as a result of the modulating signal superposed on the bias results in a non-linear electronic response. As a result, if excitation can be described by a single frequency, harmonics of this frequency will also appear, whereas if the resultant of two or more frequencies is used for modulation, components corresponding to the possible linear combinations of these frequencies (intermodulation) are observed.

A typical example is a homogenous n-type bulk semiconductor material in which the dopant concentration is N, and which is equipped with an ohmic contact providing a good electrical contact, and a rectifying contact having an F surface area. Let us assume that both contacts are ideal. Around room temperature, the bulk of this semiconductor material will contain electrons in N concentration, to compensate the positive charge of the ionized dopants. It is well known that a reverse bias (U) applied to this bipolar device (relative to the inside of the semiconductor sample or, which is practically the same, to the ohmic contact) results in the formation of a space charge (depletion) layer having a depth of W, which is practically devoid of mobile carriers (in this case electrons). Therefore, the site-dependencies of the electrical potential $(U(x))$ and field strength $(E(x))$ are determined by the charge of the ionized dopants, as shown hereinbelow.

$$U(x) = \frac{qN}{2\epsilon}(W-x)^2 \qquad (1)$$

$$E(x) = \frac{qN}{\epsilon}(W-x) \qquad (2)$$

In equations (1) and (2) $\epsilon$ is the dielectric constant of the semiconductor material, q is the electron charge, and x $(\leq W)$ is the distance from the surface.

The uncompensated charges in the space charge layer are screened by the charges on the rectifying contact at the semiconductor - rectifying contact interface. Any change in the depth of the space charge layer will necessarily result in a change in the number of these charges, which in turn results in a current (I) proportionate to the rate of this change:

$$Q = FaNw \qquad (3)$$

$$I = \frac{dQ}{dt} = FqN\frac{dW}{dt} \qquad (4)$$

The current and voltage measured on the test sample have a non-linear relationship with each other (see the equations (1) and (4)), which results in intermodulation. Let us assume that the sample is excited at two different frequencies ($\Omega_1$ and $\Omega_2$), and the sample is in an operating point corresponding to an $U_{dc}$ reverse bias (and an $I_{dc}$ leakage current). By neglecting the intermodulation products above the first order, the voltage on the sample is $$U = U_{dc} + U_{\Omega_1}*\sin(\Omega_1*t) + U_{\Omega_2}*\sin(\Omega_2*t) + U_{\Omega_-}*\cos((\Omega_1-\Omega_2)*t) - U_{\Omega_+}*\cos((\Omega_1+\Omega_2)*t) \qquad (5)$$

whereas the curent passing through the sample is $$I = I_{dc} + I_{\Omega_1}*\cos(\Omega_1*t) + I_{\Omega_2}*\cos(\Omega_2*t) + I_{\Omega_-}*\sin((\Omega_1-\Omega_2)*t) + I_{\Omega_+}*\sin((\Omega_1+\Omega_2)*t) \qquad (6)$$

In the simplest cases, excitation may be realized by applying voltage or current, which can be relatively freely varied by the feedback used in a given electrical circuit. The components are interrelated according to equations (1Z) to (4). When the exciting voltage is $U = U_{dc} + U*\{\sin(\Omega_1*t) + \sin(\Omega_2*t)\}$, (i.e., voltage generator mode), the depth and the carrier concentration can be calculated from the equations (7) and (8)

$$W = F\epsilon \frac{U_\approx}{I_{\Omega_1}/\Omega_1} \qquad (7)$$

$$N = \frac{1}{2\epsilon qF^2} * \frac{1}{U_\approx} * \frac{(I_{\Omega_1}/\Omega_1)^3}{I_{\Omega_-}/(\Omega_1 - \Omega_2)} \qquad (8)$$

In this case, the currents $I_{\Omega_1}$ and $I_{\Omega_2}$ are measured, and the sample is excited with a known voltage $U_\approx$, wherein the subscript "$\approx$" denotes an alternating signal.

In a current generator mode, when the current is $I = I_{dc} + I_\approx*\{\cos(\Omega_1*t) + \cos(\Omega_2*t)\}$, the depth and the carrier concentration can be determined using the equations (9) and (10)

$$W = F\epsilon \frac{U_{\Omega_1}}{I_\approx/\Omega_1)} \qquad (9)$$

$$N = \frac{1}{2\epsilon qF^2} * \frac{(I_\approx^2/\Omega_1/\Omega_2)}{U_{\Omega_-}} \qquad (10)$$

Here, the voltages $U_{\Omega_1}$ and $U_{\Omega_2}$ are measured, and a known current $I_\approx$ is passed through the sample.)

We have recognized that if the resultant of two signals with different frequencies, one of which may be called "measuring signal" and the other one "modulating signal", is superposed on the d.c. bias, the two frequencies have equally important roles. It follows, that when the semiconductor material or structure is capable of an acceptable response only within a relatively narrow frequency range (due to the disturbing factors detailed hereinabove), desirably both frequencies should be within this range. Without this recognition, the measured parameters will be unreal.

For example, in a system using a contact formed at a semiconductor-electrolyte interface, capacitance measurement might appear easy with a 3 kHz measuring signal. However, the concentration values determined in this way will be unreal if the modulation frequency is two orders of magnitude lower, i.e. about 30 Hz. In this case, the 30 Hz modulation frequency can be followed by the internal electrochemical potentials in the electrolyte contact, therefore, the derivative of the capacitance will include information characteristic of the liquid properties.

We have also recognized that the formation of harmonics of the same order is subject to similar conditions. Thus in the extreme, if the formation of one of the intermodulation products equal to the sum and the difference of the frequencies of two different signals is avoided, the formation of the other one will be automatically avoided.

Also, in order to optimize the measurement, not only the measuring and the modulation signals but the intermodulation products as well should be in the optimum frequency range, or at least in its proximity. The difficulty is that as the modulation frequency approaches the measuring frequency, the frequencies of these intermodulation products will be moving farther away from this optimum frequency range, and will cover a broader frequency range.

Nonetheless, it is possible to minimize the difference between the lowest and the highest of the measuring and modulation signals and their harmonics of the first order. We have found that the range determined by these frequencies is narrowest when the measuring signal frequency is the double of the frequency of the modulation signal. In this case, the highest frequency (the sum of these two) will be three-times the lowest frequency. At this theoretical optimum, the difference of the two frequencies would be identical with the absolute value of the lower frequency, therefore, only the sum of these two frequencies would be used out of the intermodulation products. This optimum is a virtual one only because, due to the unavoidable distortions, the third harmonic of the modulation signal would also be formed and detected, which is identical with the sum of the measuring and modulation frequencies.

In a particularly preferred embodiment, the value of the signal corresponding to the difference of the measuring and modulation signals should be at about the same relative distance from each of these two signals. This happens when the frequency of the measuring signal is $(3+\sqrt{5})/2$-times the frequency of the modulation signal. For this case, the ratio of the highest and lowest frequencies will be about 3.6, which is in excellent agreement with the theoretical optimum 3.

In the currently used measuring arrangements, the modulation signal is separated from the demodulated signal for further processing. This requires the simultaneous transmission, amplification and demodulation of three signals (the measuring signal, and the harmonics corresponding to the sum and the difference of the measuring and modulation signals, respectively) in the same channel, free of distortions. Following demodulation, the modulation signal must be again amplified and demodulated. Since the demodulated signal is the resultant of the modulation product corresponding to the sum and the difference of the two (measuring and modulation) frequencies, it is equally important that each of the above-mentioned modulation products be without distortions.

We have recognized that by using the measuring technique according to the present invention, perfectly satisfactory results can be obtained by employing two separate channels (amplifiers and phase-sensitive demodulators), one providing distortion-free transmission at one of the input frequencies and the other one at the first order intermodulation frequency to be detected. In this way, each channel is required to provide distortion-free transmission at one frequency only; a requirement that is considerably easier to meet. As a result, the decreases in the amplitudes of signals having different frequencies, which are always present, or the possible phase shifts in these frequencies (e.g. due to the filters used to improve the noise/noise ratio and/or the dynamic region) will have no effect on the results. On the contrary, the decrease of noise may improve the system parameters. Since in this case, only one of the first order intermodulation products is selected for further processing, the disturbances in the formation of the other one will only have a minor, indirect effect on the information content of the measured signals. Of course, this arrangement requires a reference signal corresponding to the frequency of the desired harmonic.

As a logical consequence of the foregoing, there are two alternative approaches possible, depending on whether the frequency of the so called measuring signal or the frequency of the so called modulation signal is higher. Whichever is the case, it is obvious that the sum of the two frequencies is outside of the region determined by the lower and the higher frequencies, whereas the difference of these two frequencies is within that region or is smaller than either of them. If the measuring frequency is higher than the modulation frequency, the ideal measuring/modulation frequency ratio is $(3+\sqrt{5})/2$, and consequently, the ratio of the difference of the measuring and modulation frequencies to the modulation frequency ideally is $(1+\sqrt{5})/2$. Similar ratios are obtained, if the modulation frequency is higher than the measuring frequency. The choice between these two possibilities depends on the question, whether the capacitive properties of the sample are more sensitive to the frequencies above or below the frequency range that has been found optimal for performing the measurement. Although the two possibilities are equivalent with respect to the intermodulation product, the accuracy of the determination of the carrier concentration is greatly influenced by the electrical response at the measuring frequency (and the error in determining this electrical response). Accordingly, of the two excitation frequencies, the one at which the behavior of the semiconductor sample is closer to optimum should be chosen as measuring frequency, and should be further processed. (In most instances, it is more advantageous if the measuring signal has the higher frequency.) It is emphasized that the above ideal ratios are not critical, and usually deviations up to about 10% are not expected to cause serious difficulties.

In a preferred embodiment, the value of the first order intermodulation product (i.e., the frequency difference between the two periodic excitation signals) wi within about 10% of the geometrical mean of the two frequencies (i.e., within 10% of the square root of the product of the two frequencies).

In a preferred embodiment of the present invention, measuring signal, the modulation signal and the reference signals (which equal to the frequency of the measuring signal and the intermodulation product, respectively, and are in a phase strictly related to the measuring signal and the modulation signal) can be generated with a frequency synthesizer, requiring only one clock signal. By changing the clock signal, this synthesizer is capable of an easy and flexible change of the operation frequency region within a relatively wide region, without altering the ratios and phase relations of the frequencies of the individual components. Of course, the frequency synthesizer is not able to produce frequencies that can be described by irrational numbers, but it can generate frequencies corresponding to the ratio of integers, such as 5:2, 8:3, 11:4, 13:5, etc. These ratios are a good approach to the optimum. The higher the prime whole numbers the ratio of which is utilized, the smaller is the probability of the formation of disturbing intermodulation products due to the non-linearity of the electronics.

The method provided by the present invention is fundamentally different from the (capacitance or conductance measurement) methods known in the art for determining the carrier concentration or the distribution of carrier concentration in semiconductor materials in that it enables the direct measurement of a non-linear behavior of a semiconductor sample.

A measuring arrangement suitable for practicing the present invention is illustrated in FIG. 1, wherein (1) is a diode representing the semiconductor sample to be characterized;

(2) an adder circuit to drive the sample with the sum of the two excitation signals and of the bias voltage;

(3) a current to voltage converter to detect the current flowing through the sample as response for the excitation signals;

(4) a digital oscillator and frequency divider circuit to produce the excitation and the reference signals;

(5) and (6) are low-pass filters to smooth the excitation signals;

(7) and (8) are amplifiers to amplify the base frequency and the difference signals;

(9) and (10) are phase-sensitive rectifiers to rectify the two a.c. signals.

All of the above circuits can be realized by use of commercially available circuitry and parts (operational amplifier, analog multiplexer and logical integrated circuit of any type, ECL, TTL, CMOS, etc.).

FIG. 2 shows the carrier concentration as a function of depth in homogeneous n-type GaAs material determined by two methods. The rectifying contact was formed by contacting an electrolyte with a well defined area of the semiconductor sample using a commercial electrochemical cell, with a carbon working electrode and a platinum reference electrode. The electrolyte used in the measurements was a solution of 0.4 mol NaOH and 0.1 mol Na$_2$EDTA in water. Both measurements were performed on exactly the same area of the same sample, in the same sample holder and in the same solution.

The data presented with dashed line were measured with a "reference" method, with an equipment (type No. PN 4200 made by Polaron Ltd.) operating according to U.K. Patent No. 1,482,929 and its U.S. equivalents Nos. 4,168,212 and 4,028,207 (Factor et al.) In the Polaron equipment the test device (DUT) is excited with a measuring signal of 3000 Hz, and with a modulating signal of approximately 30 Hz. The electrical response of the DUT for the measuring signal is amplified and demodulated, the response for the modulation signal is derived from the demodulated measuring signal.

The data represented with solid line was measured with an equipment (type No. MCS-90 made by SEMILAB Rt) constructed according to the invention. The frequencies of the two periodic excitation signals are 6250 Hz and 6250*5/13 Hz (approximately 2404 Hz) while the two signals selected for further analysis (amplification and demodulation) have frequencies of 6250 Hz and 6250*8/13 Hz (approximately 3846 Hz)

The two curves show the characteristic differences between the two methods. In spite of the homogeneous distribution of the donors in the GaAs substrate the dashed curve, measured with the reference method, shows strong virtual inhomogeneities in the distribution of the carrier concentration, while the solid curve, measured with the method according to the invention, delivers data showing practically no inhomogeneity in depth and accordingly much higher reliability.

In the foregoing description and in the claims the term "semiconductor" is used in the broadest sense and includes elementary and compound semiconductors, any bi- or multilayer semiconductor structures, including mono- and heteroepitaxial structures, semiconductor devices, etc.

The foregoing description details specific techniques that can be employed to practice the present invention, and represents the best mode contemplated. However, it is apparent for one of ordinary skill in the art that numerous variations are possible without deviating from the basic concept of the invention. Thus, however, detailed the foregoing might appear in text, it should not be construed as limiting the overall scope hereof; rather, the ambit of the present invention is to be governed only by the lawful construction of the appended claims.

We claim:

1. A process for determining the carrier concentration in a semiconductor by applying between an ohmic contact and a rectifying contact formed on said semiconductor, a d.c. voltage resulting in a reverse bias $U_{dc}$, and two periodic excitation signal having the frequencies $\Omega_1$ and $\Omega_2$, respectively, wherein $\Omega_1$ is bigger than $\Omega_2$, such that $\Omega_1$, $\Omega_2$, their difference $(\Omega_1-\Omega_2)$ and their sum $(\Omega_1+\Omega_2)$ are in the same order of magnitude, selecting two components from the electronic response of said semiconductor to the excitation, the first component being the electrical response to said frequency $\Omega_1$ or $\Omega_2$, and the second component being a chosen first order intermodulation product of $\Omega_1$ and $\Omega_2$, and determining said carrier concentration by simultaneous, parallel analysis of said first and second components.

2. The process according to claim 1, wherein the frequency of said first order intermodulation product equals to the sum of said frequencies $\Omega_1$ and $\Omega_2$.

3. The process according to claim 1, wherein the frequency of said first order intermodulation product equals to the difference of said frequencies $\Omega_1$ and $\Omega_2$.

4. The process according to claim 3, wherein said first component is the periodic excitation signal having the lower frequency ($\Omega_2$).

5. The process according to claim 4 wherein the frequency of said first order intermodulation product $(\Omega_1-\Omega_2)$ approximates $\sqrt{(\Omega_1*\Omega_2)}$.

6. The process according to claim 5 wherein the frequency of said first order intermodulation product $(\Omega_1-\Omega_2)$ is within about 10% of $\sqrt{(\Omega_1*\Omega_2)}$.

7. The process according to claim 3 wherein said first component is the periodic excitation signal having the higher frequency ($\Omega_1$).

8. The process according to claim 7 wherein the frequency of said first order intermodulation product $(\Omega_1-\Omega_2)$ approximates $\sqrt{(\Omega_1*\Omega_2)}$.

9. The process according to claim 8 wherein the frequency of said first order intermodulation product $(\Omega_1-\Omega_2)$ is within about 10% of $\sqrt{(\Omega_1*\Omega_2)}$.

10. The process according to claim 5 wherein the ratios of the frequencies of said excitation signals and said selected two components correspond to the ratios of whole numbers.

11. The process according to claim 1 wherein the frequency of said higher periodic excitation signal $\Omega_1$, which is the measuring frequency, is about $(3+\sqrt{5})/2$ times the frequency of said lower periodic excitation signal $\Omega_2$, which is the modulation frequency.

12. The process according to claim 1 wherein said rectifying contact is formed by contacting said semiconductor with an electrolyte.

13. The process according to claim 12 wherein said electrolyte is suitable of the anodic dissolution of said semiconductor, and said process is used for the determination of the carrier concentration as a function of depth.

14. Apparatus for determining the carrier concentration in a, comprising a semiconductor sample having an ohmic contact and a rectifying contact comprising:
means for applying a d.c. voltage between said contacts, resulting in a reverse bias $U_{dc}$;
excitation means for generating two periodic excitation signals having high frequencies $\Omega_1$ and $\Omega_2$, respectively; wherein $\Omega_1$ is bigger than $\Omega_2$ such that $\Omega_1$, $\Omega_2$, their difference $(\Omega_1-\Omega_2)$ and their sum $(\Omega_1+\Omega_2)$ are in the same order of magnitude;
means for amplifying two components selected from the electronic response of said semiconductor to said excitation, the first component being the electrical response to said frequency $\Omega_1$ or $\Omega_2$, and the second component being a first order intermodulation product of one of $\Omega_1$ and $\Omega_2$; and
means for performing simultaneous parallel analysis of said first and second components to determine carrier concentration in said semiconductor.

15. The apparatus according to claim 14, further including frequency synthesizer means for generating said two periodic excitation signals from a single clock signal.

16. The process according to claim 6 wherein the ratios of the frequencies of said excitation signals and said selected two components correspond to the ratios of whole numbers.

17. The process according to claim 8 wherein the ratios of the frequencies of said excitation signal and said selected two components correspond to the ratios of whole numbers.

18. The process according to claim 9 wherein the ratios of the frequencies of said excitation signals and said selected two components correspond to the ratios of whole numbers.

19. The apparatus of claim 14, wherein said means for performing includes two phase-sensitive rectifiers for rectifying said selected two periodic components.

20. The apparatus of claim 14, wherein said rectifying contact is formed by contacting said semiconductor with an electrolyte.

21. The apparatus of claim 20, wherein said electrolyte is suitable for anodic dissolution of said semiconductor, and wherein said apparatus determines carrier concentration as a function of depth.

* * * * *